(12) United States Patent  (10) Patent No.: US 7,091,518 B2
Yoshida et al.  (45) Date of Patent: Aug. 15, 2006

(54) SEMICONDUCTOR DEVICE

(75) Inventors: Tetsuya Yoshida, Kawasaki (JP);
Yoshihiko Koike, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1 day.

(21) Appl. No.: 11/043,336

(22) Filed: Jan. 27, 2005

(65) Prior Publication Data
US 2006/0049400 A1   Mar. 9, 2006

(30) Foreign Application Priority Data
Sep. 9, 2004   (JP)   ............................. 2004-262392

(51) Int. Cl.
*H01L 23/58* (2006.01)
(52) U.S. Cl. .................... 257/48; 257/758; 257/798; 365/63; 365/94
(58) Field of Classification Search ................ 257/48, 257/758, 798; 365/63, 94
See application file for complete search history.

(56) References Cited

U.S. PATENT DOCUMENTS 5,408,428 A  *  4/1995  Burgess et al. ............... 365/94
5,644,144 A       7/1997  Ray
5,723,876 A       3/1998  Ray
5,831,280 A     11/1998  Ray
6,933,547 B1 *  8/2005  Catalasan et al. ........... 257/203

FOREIGN PATENT DOCUMENTS

JP      8-181068      7/1996

* cited by examiner

*Primary Examiner*—Sara Crane
(74) *Attorney, Agent, or Firm*—Arent Fox PLLC

(57) ABSTRACT

A first wiring part in a first wiring layer is a starting terminal that is connected to a ground potential. The first wiring part and a second wiring part in a second wiring layer are connected by a first connecting part. The second wiring part and a third wiring part in a third wiring layer are connected by a second connecting part. A fourth wiring part continuously connected with the third wiring part and a fifth wiring part in the second wiring layer are connected by a third connecting part. The fifth wiring part and a sixth wiring part in the first wiring layer are connected by a fourth connecting part. A conducting path that is continuously connected from the starting terminal to an output end is formed by connecting a mound-shaped conducting path thus formed.

26 Claims, 17 Drawing Sheets

SEMICONDUCTOR DEVICE

CROSS-REFERENCE TO RELATED APPLICATIONS

This application is based upon and claims the benefit of priority from the prior Japanese Patent Application No. 2004-262392, filed on Sep. 9, 2004, the entire contents of which are incorporated herein by reference.

BACKGROUND OF THE INVENTION

1) Field of the Invention

The present invention relates to a semiconductor device, and more particularly, to a semiconductor device having chip information indicating a revision history.

2) Description of the Related Art

Generally, revision of logic and a layout is performed for several times during development and manufacturing of a semiconductor chip for a purpose of correcting the logic or improving quality of the semiconductor chip. Information on a history of the revision is kept by a manufacturer of the semiconductor chip, and chip information that indicates a version number is stored in the semiconductor chip. By reading the chip information from the semiconductor chip and by checking the chip information against the history of the revision, it is possible for a user and the manufacturer to learn a revision history of the semiconductor chip.

Conventionally, the chip information is stored in a memory such as a read-only memory (ROM) in a chip. Therefore, when the chip information is required, the chip information is read from the memory. Several bits data that is formed with "0" or "1" is formed using a part of a specific wiring layer, for example, a first wiring layer, in a multilayer wiring structure that forms the memory. In other words, for example, a wiring for several bits to store the chip information is arranged in the first wring layer so that the wiring outputs the data of "0" or "1" that is predetermined as the chip information.

A wiring pattern for the wiring to store the chip information is determined based on a mask pattern used to form the wiring in the first wiring layer on a surface of a semiconductor during a process of manufacturing the semiconductor chip. Therefore, when the revision is performed, it is necessary to change the mask pattern because a new piece of the chip information is to be stored in the memory.

An apparatus in which an output value of the apparatus is changeable between "0" and "1" just by changing a wiring in a single layer is disclosed in, for example, Japanese Patent Application Laid-Open No. H8-181068. The apparatus includes two input terminals and two output terminals. "0" is input into one of the input terminals, and "1" is input into another of the input terminals, and "0" is output from one of the output terminals, and "1" is output from another of the output terminals. In the apparatus, N pieces of programmable cells that reverse outputs of the two output units by changing an internal wiring are formed corresponding to a 1-N layer, and are connected in series.

In the above conventional technology, it is possible to perform the revisions to change the wiring pattern to revise the logic and to improve the quality, and the revisions to change the wiring pattern for updating the chip information at a same time if the wirings of which the wiring pattern is to be revised are in a same wiring layer (for example, in the first wiring layer). In other words, in this case, it is only necessary to change the mask pattern to form the wiring of the first wiring layer.

However, a wiring layer in which the wiring to store the chip information is fixed, for example, to the first wiring layer, when a wiring layer of which the wiring pattern is to be revised to revise the logic and to improve the quality is not the first wiring layer, it becomes necessary to change the mask pattern of both the wiring layers. Therefore, a number of the mask pattern to be changed at a version revision increases by one, resulting increase of a manufacturing cost. A "mask" includes a "reticle" that is used when projection by a lithography that is called "stepper" is repeated while shifting a position to be projected on a whole surface of a wafer.

SUMMARY OF THE INVENTION

It is an object of the present invention to solve at least the above problems in the conventional technology.

A semiconductor device according to one aspect of the present invention includes a wiring unit that is arranged in each of a plurality of wiring layers; a starting terminal that is formed with the wiring unit that is arranged in one of the wiring layers; and a connecting unit that electrically connects the wiring units in different wiring layers. The starting terminal is connected to a first potential level. It is selectable whether to form the connecting unit by changing a mask pattern. It is selectable whether to form the wiring unit by changing the mask pattern. The wiring unit is connectable to either of the first potential level and a second potential level, and forms a conducting path that is continuously connected from either of the staring end and an arbitrarily wiring unit to an output terminal via the connecting unit. The conducting path is formed with a combination of a first path extending from a lower wiring layer to an upper wiring layer from the starting terminal toward the output terminal and a second path extending from the upper wiring layer to the lower wiring layer from the starting terminal toward the output terminal. The output terminal is either of the first potential level and the second potential level.

A semiconductor device according to another aspect of the present invention includes a plurality of chip-code creating units that output either of a first potential level and a second potential level in response to a read request from an external unit. Each of the chip-code creating units includes a wiring unit that is arranged in each of a plurality of wiring layers; a starting terminal that is formed with the wiring unit that is arranged in one of the wiring layers; and a connecting unit that electrically connects the wiring units in different wiring layers. The starting terminal is connected to a first potential level. It is selectable whether to form the connecting unit by changing a mask pattern. It is selectable whether to form the wiring unit by changing the mask pattern. The wiring unit is connectable to either of the first potential level and a second potential level, and forms a conducting path that is continuously connected from either of the staring end and an arbitrarily wiring unit to an output terminal via the connecting unit. The conducting path is formed with a combination of a first path extending from a lower wiring layer to an upper wiring layer from the starting terminal toward the output terminal and a second path extending from the upper wiring layer to the lower wiring layer from the starting terminal toward the output terminal. The output terminal is either of the first potential level and the second potential level.

The other objects, features, and advantages of the present invention are specifically set forth in or will become apparent from the following detailed description of the invention when read in conjunction with the accompanying drawings.

DETAILED DESCRIPTION

Exemplary embodiments of a semiconductor device according to the present invention will be explained in detail with reference to the accompanying drawings. It is noted that in an explanation below, three wiring layers are used to create chip information in a multilayer wiring structure. The wiring layers are called a first wiring layer that is arranged in a first layer, a third wiring layer that is arranged in a second layer, and a second wiring layer that is arranged in a third layer respectively from a lowest layer.

Figure 1:
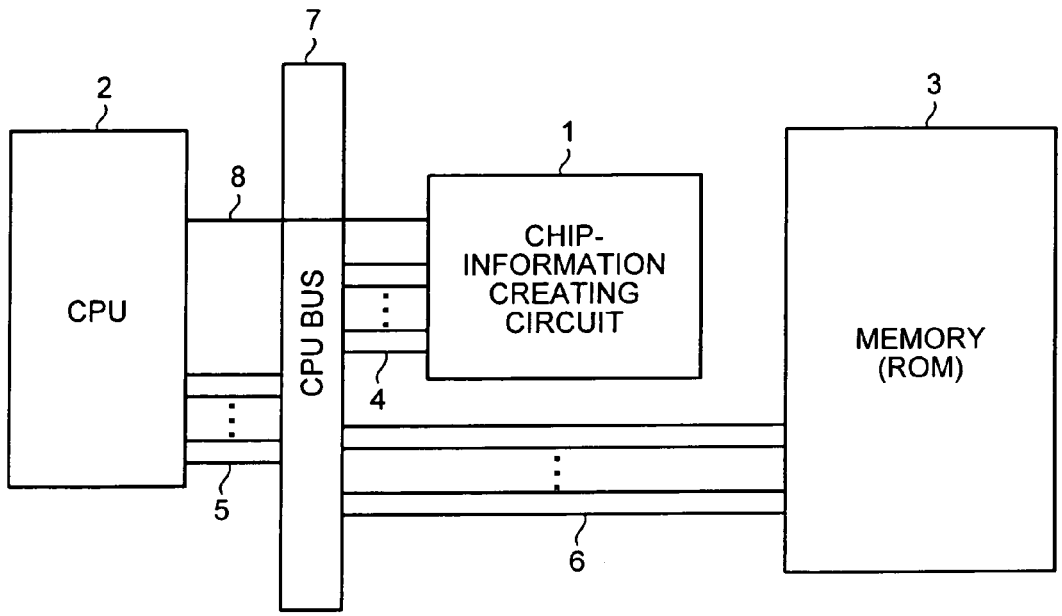
FIG. 1 is a block diagram of a semiconductor chip according to an embodiment of the present invention.

FIG. 1 is a block diagram of a semiconductor chip according to an embodiment of the present invention. As shown in FIG. 1, the semiconductor chip includes a chip-information creating circuit 1, a central processing unit (CPU) 2, and a memory 3 such as a read-only memory (ROM) that are connected through address/data buses 4, 5, and 6. Moreover, the chip-information creating circuit 1 and the CPU 2 are directly connected to each other through a read signal line 8. When the CPU 2 outputs a read signal to the chip-information creating circuit 1 to access an address of the chip information, the chip-information creating circuit 1 outputs the chip information to the CPU 2. Thus, the chip information is obtained.

Figure 2:
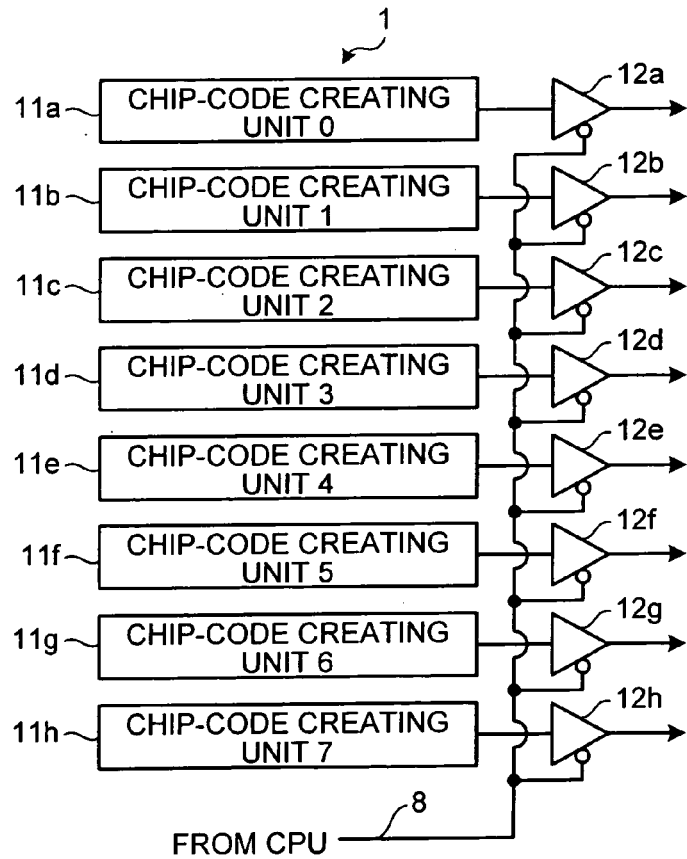
FIG. 2 is block diagram of a chip-information creating circuit according to the embodiment.

FIG. 2 is a block diagram of the chip-information creating circuit 1. As shown in FIG. 2, the chip-information creating circuit 1 includes eight pieces of chip-code creating units 11a, 11b, 11c, 11d, 11e, 11f, 11g, and 11h to which a necessary amount of bit formed with "0" or "1" is input as the chip information. A number of the chip-code creating unit is not limited to a particular number, but eight units of the chip-code creating units are prepared in this example. To an output terminal of each of the chip-code creating units 11a, 11b, 11c, 11d, 11e, 11f, 11g, and 11h, for example, one each of buffers 12a, 12b, 12c, 12d, 12e, 12f, 12g, and 12h is connected. Each of the buffers 12a, 12b, 12c, 12d, 12e, 12f, 12g, and 12h outputs an output value ("0" or "1") of each of the chip-code creating units 11a, 11b, 11c, 11d, 11e, 11f, 11g, and 11h based on the read signal transmitted from the CPU 2. For example, among eight bits of the chip information, a first bit, a second bit, and a third bit may be used as a region to indicate a version number for a layout, and a fourth bit, a fifth bit, and a sixth bit may be used as a region to indicate a version number for logic.

Figure 3:
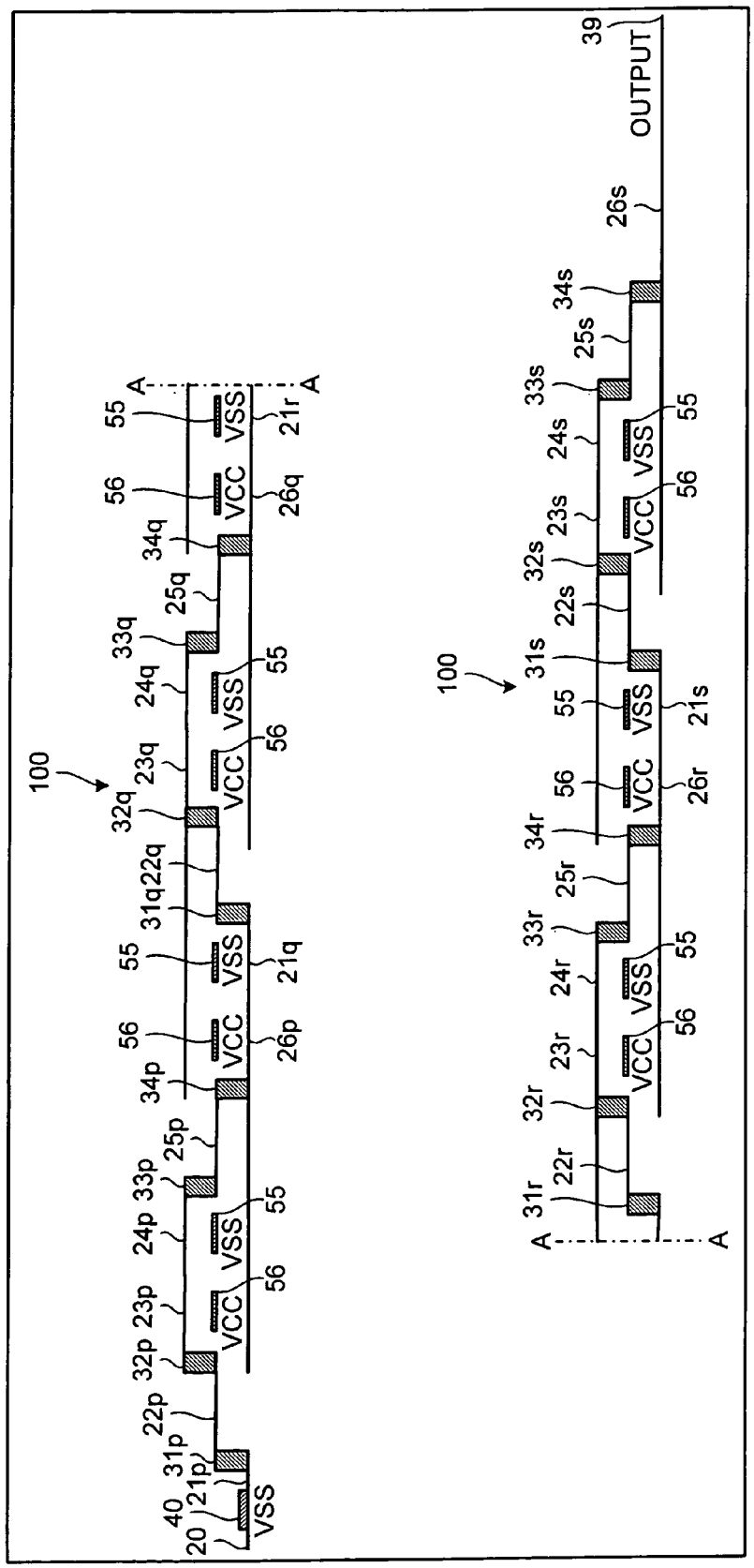
FIG. 3 is a cross-section of a chip-code creating unit according to the embodiment.

A wiring structure of the chip-code creating units 11a, 11b, 11c, 11d, 11e, 11f, 11g, and 11h are explained, supposing that all the chip-code creating units 11a, 11b, 11c, 11d, 11e, 11f, 11g, and 11h have an identical wiring structure. FIG. 3 is a cross-section of the chip-code creating units 11a, 11b, 11c, 11d, 11e, 11f, 11g, and 11h. Although in FIG. 3, the wiring structure is shown in two pieces for a convenience' sake, the wiring structure is actually connected at a line A—A shown in FIG. 3.

A first wiring part 21p that is formed in the first wiring layer as shown in FIG. 3 is a starting terminal 20. The starting terminal 20 is connected to a ground potential VSS through a first connection wiring 40. The first wiring part 21p is connected to a second wiring part 22p that is formed in the third wiring layer at a portion closer to an output terminal than the first wiring part 21p through a first connecting part 31p. The second wiring part 22p is connected to a third wiring part 23p that is formed in the second wiring layer at a portion closer to the output terminal than the second wiring part 22p through a second connecting part 32p. A fourth wiring part 24p is formed in the second wiring layer, and continuously connected to an end of the third wring part 23p on a side closer to the output terminal.

The fourth wiring part 24p is connected to a fifth wiring part 25p that is formed in the third wiring layer at a portion closer to the output terminal than the fourth wiring part 24p through a third connecting part 33p. The fifth wiring part 25p is connected to a sixth wiring part 26p that is formed in the first wiring layer at a portion closer to the output terminal through a fourth connecting part 34p. Such a mound-shaped conducting path is arranged as a unit structure. By arranging one or more than one of the unit structure connected, a conducting path 100 that is continuously connected between the starting terminal 20 and an output terminal 39 is formed. The first connecting part 31p, the second connecting part 32p, the third connecting part 33p, and the fourth connecting part 34p are formed with an electrically conductive material, such as metal, injected in a via-hole that passes through an insulation film (not shown) arranged between the wiring layers that are adjacent to each other.

In the first wiring layer, a fist wiring part 21q of a second stage of the unit structure is continuously connected to an end of the sixth wiring part 26p of a first state of the unit structure described above on the side closer to the output terminal. The wiring structure of the mound-shaped conducting path of the second stage is same as that of the first stage except for the first wiring part 21p being connected to the ground potential VSS. Therefore, the explanation is not repeated. To distinguish the mound-shaped conducting path of the second stage form the mound-shaped conducting path of the first stage, in an explanation below and the appended drawings, parts in the second stage are expressed with reference characters with "q" (21q, 22q, 23q, 24q, 25q, 26q, 31q, 32q, 33q, and 34q) instead of "p", which is used in reference characters for the parts in the first stage.

As shown in FIG. 3, in the present embodiment, for example, four units of the mound-shaped conducting paths are connected between the starting terminal 20 and the output terminal 39, although a number of the mound-shaped conducting paths to be arranged are not limited to four. To distinguish the mound-shaped conducting path of a third stage from the mound-shaped conducting path of a fourth stage from the conducting path of the first and the second stages, parts in the third stage are expressed with reference characters with "r" (21r, 22r, 23r, 24r, 25r, 26r, 31 r, 32r, 33r, and 34r), and parts in the fourth stage are expressed with reference characters with "s" (21s, 22s, 23s, 24s, 25s, 26s, 31s, 32s, 33s, and 34s) instead of "p" or "q".

In the first wiring layer, a first power (not shown) line of the ground potential VSS to which the first connection wiring 40 is connected and a second power line (not shown) of a power supply potential VCC are arranged. In the second wiring layer, the first power line of the ground potential VSS and the second power line of the power supply potential are arranged. Also in the third wiring layer, the first power line of the ground potential VSS and the second power line of the power supply potential are arranged. The first power line and the second power line in the third wiring layer are formed with a main wring (not shown) and a branch wiring (not shown) that branches out form the main wiring. A branch wiring 55 of the first power line and a branch wiring 56 of the second power line branches out from the main wiring and reach to a portion below the third wiring part 23p and the fourth wiring part 24p are arranged.

The sixth wiring part 26p is extended toward the staring end 20 in the first wiring layer, and reaches to a portion below the branch wirings 55 and 56. In the third wiring layer, the branch wirings 55 and 56 is extended and reach to a portion above the sixth wiring part 26p and the first wring part 21q of the second stage. The third wring part 23q is extended toward the starting terminal 20 in the second wiring layer, and reaches to a portion above the branch wirings 55 and 56.

Thus, the branch wirings 55 and 56 are arranged in the first power line and the second power line in the second wiring layer, and the sixth wring part 26p and the third wiring part 23q are extended to the portion above or below the branch wirings 55 and 56. The conducting paths of the second stage, the third stage, and the fourth stage also have such a structure. However, in the example shown in FIG. 3, a sixth wiring part 26s of the fourth stage is connected to the output terminal. Moreover, the branch wirings 55 and 56, and a portion that is extended from a wiring part in the third wiring layer is not arranged above the sixth wiring part 26s.

Figure 4:
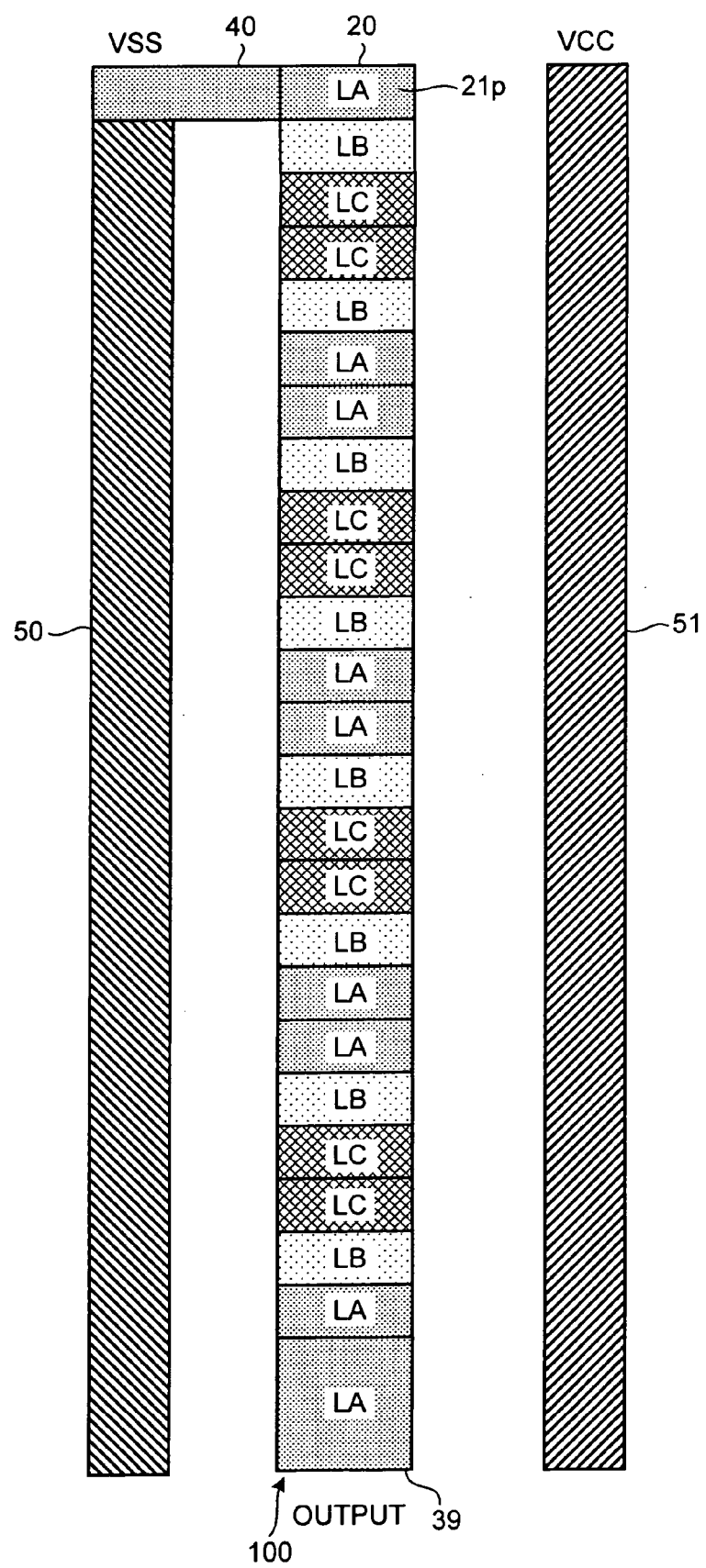
FIG. 4 is a plan view of the chip-information creating circuit (1)
Figure 5:
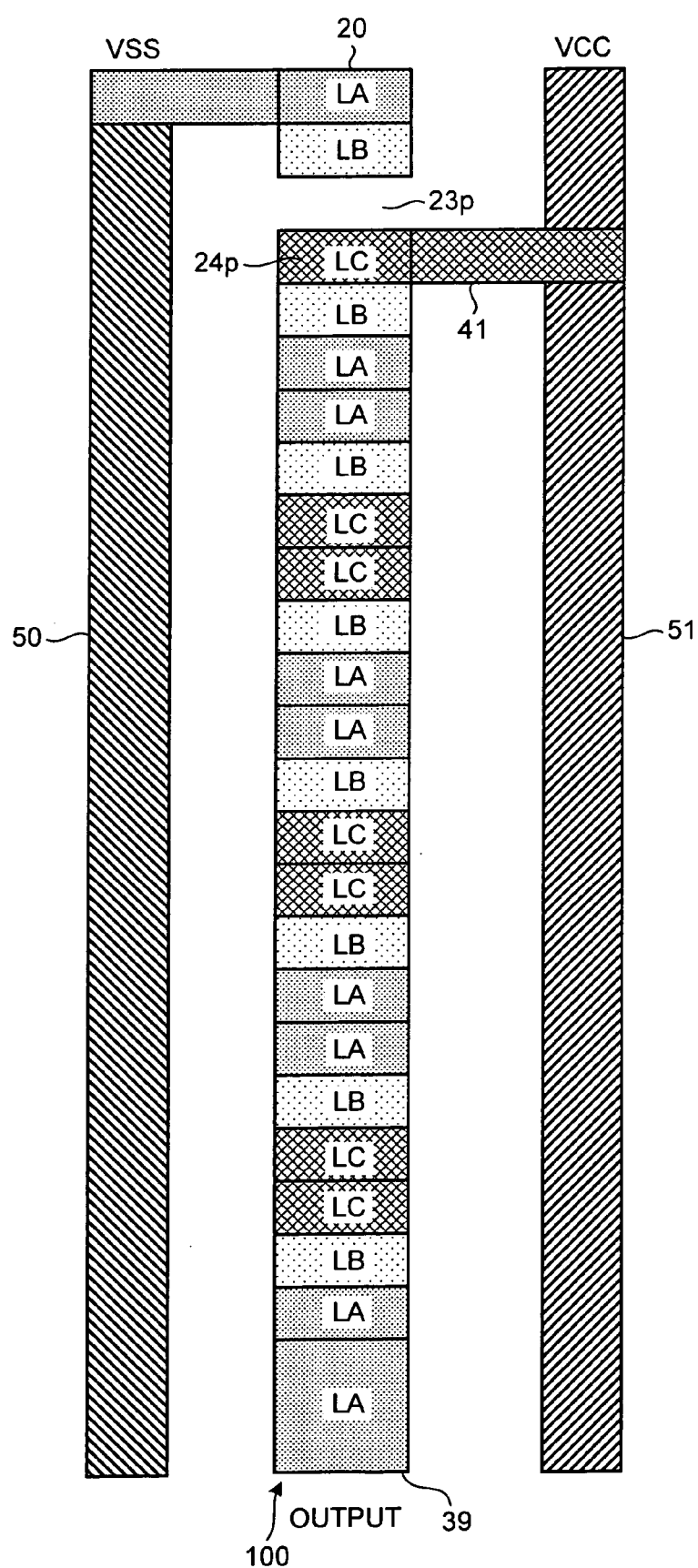
FIG. 5 is a plan view of the chip-information creating circuit (2)
Figure 6:
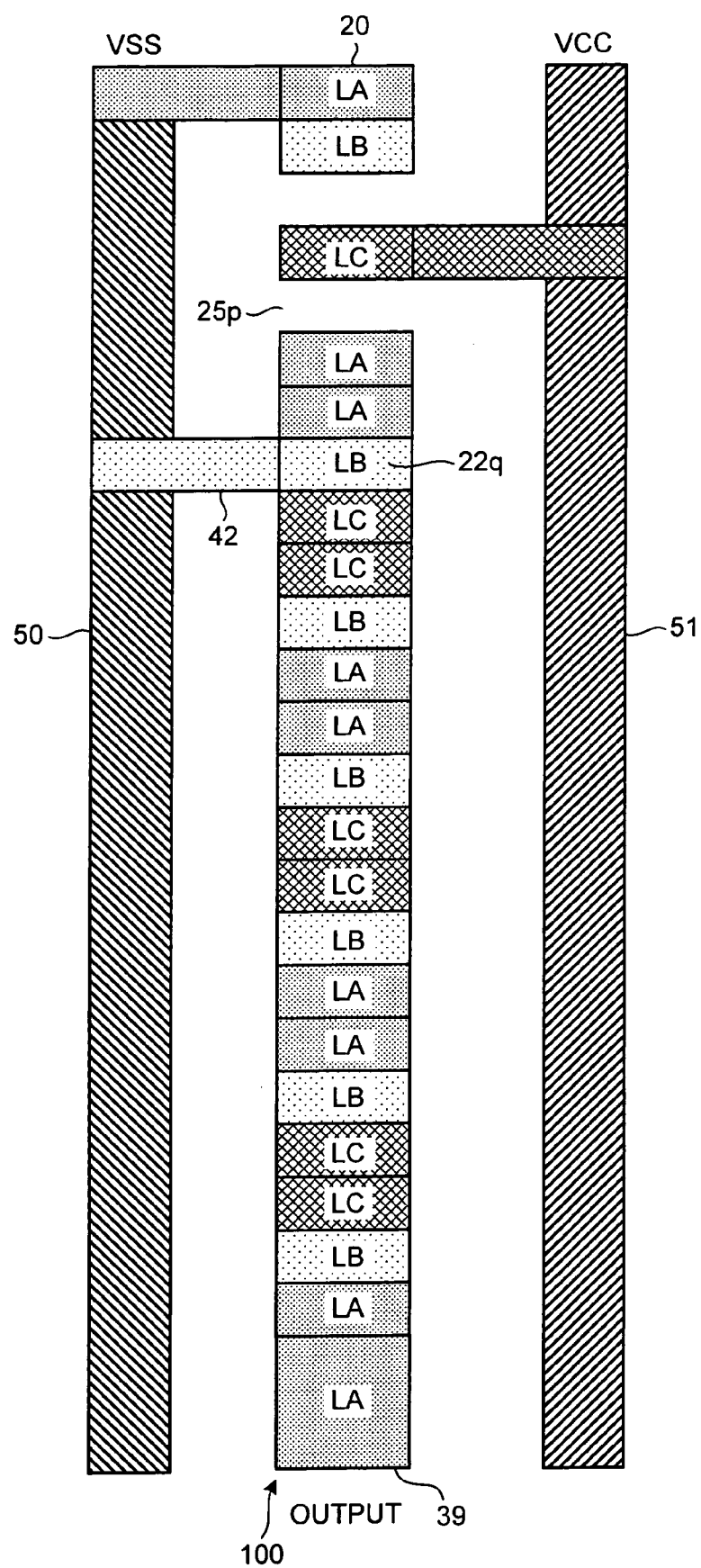
FIG. 6 is a plan view of the chip-information creating circuit (3)
Figure 7:
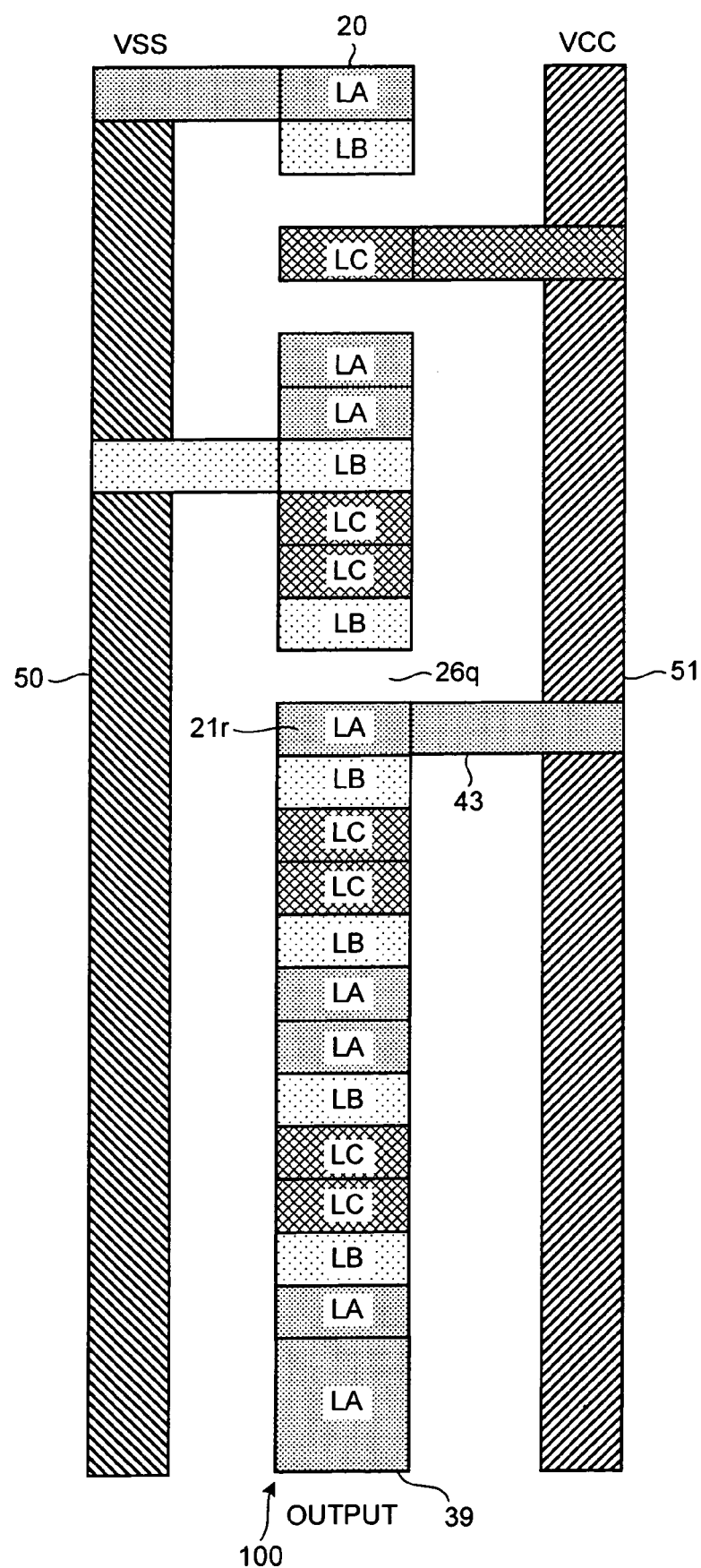
FIG. 7 is a plan view of the chip-information creating circuit (4)
Figure 12:
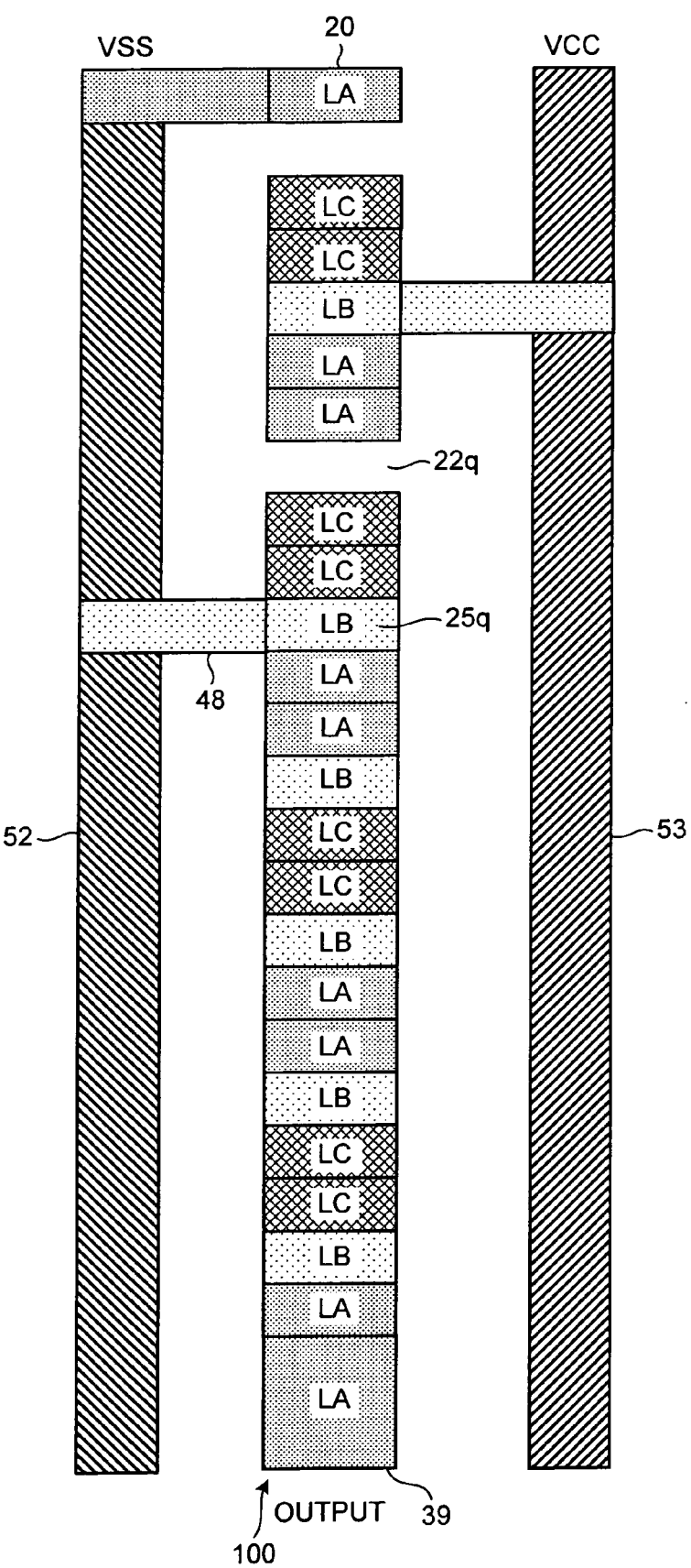
FIG. 12 is a plan view of the chip-information creating circuit (9)
Figure 13:
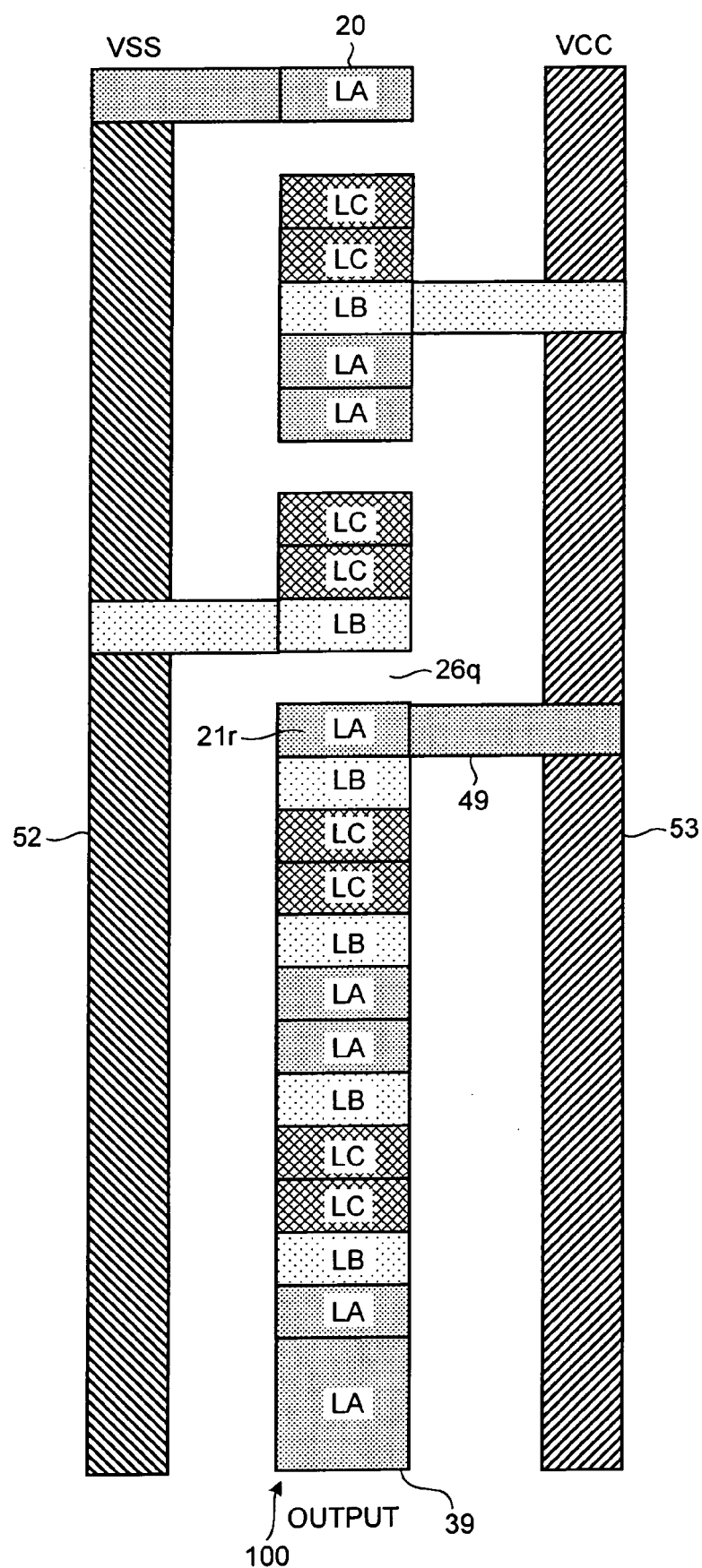
FIG. 13 is a plan view of the chip-information creating circuit (10)
Figure 14:
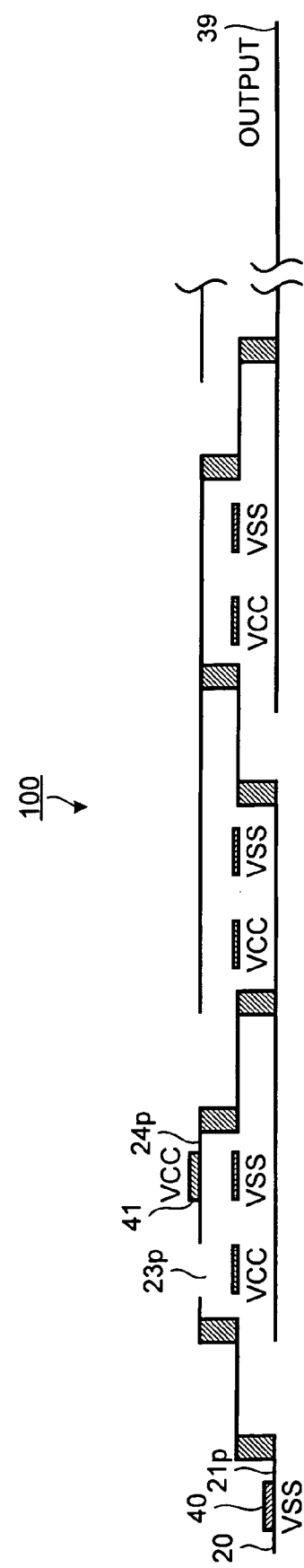
FIG. 14 is a cross-section of the chip-information creating circuit (1)
Figure 15:
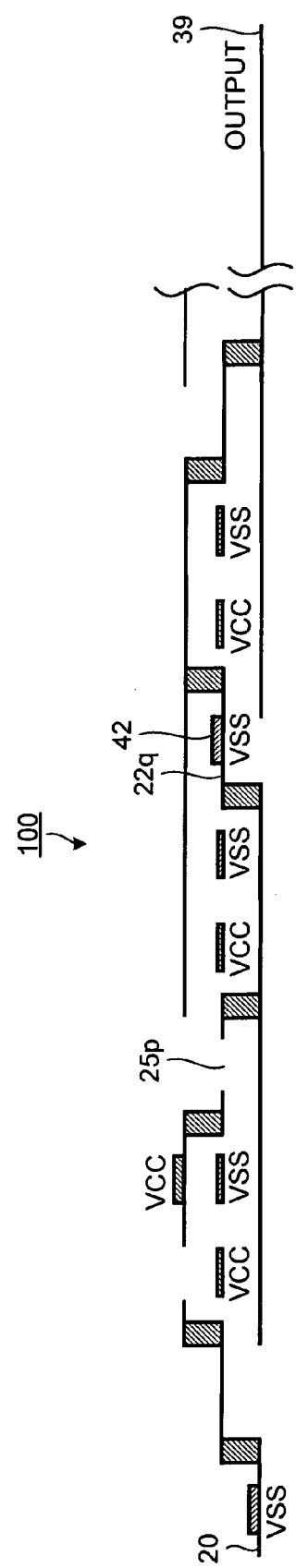
FIG. 15 is a cross-section of the chip-information creating circuit (2)
Figure 16:
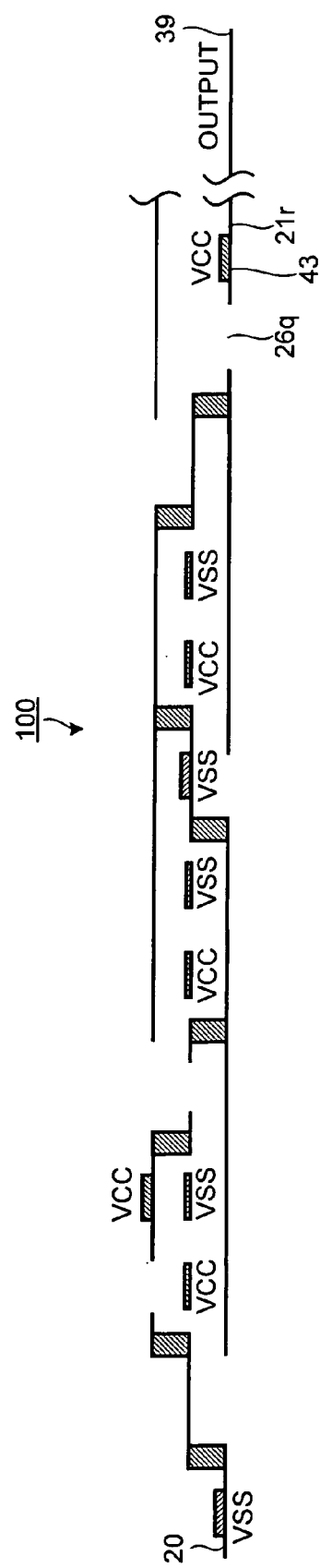
FIG. 16 is a cross-section of the chip-information creating circuit (3)

FIGS. 4 to 13 are top plan views of the conducting path 100, and FIGS. 14, 15 and 16 are cross-sections of a part of the conducting path 100 shown in FIGS. 5, 6, and 7 respectively. For convenience' sake, a variation in values only for three bits from an LSB is explained here among the chip-code creating units 11a, 11b, 11c, 11d, 11e, 11f, 11g, and 11h shown in FIG. 2, and an explanation for values from a fourth bit to an MSB is omitted.

As shown in FIG. 4, in a first version, in either of the first bit, the second bit, and the third bit, which correspond to the chip-code creating unit 11a, the chip-code creating unit 11b, and the chip-code creating unit 11c respectively, the mask patterns of the mask and the via-hole for each of the wiring layers are formed in such a manner that the first wiring part 21p, which is the starting terminal 20, is connected to the power line 50 of the ground potential VSS through the first connection wiring 40. Thus, the conducting path 100 that is structured as shown in FIG. 4 is formed. A cross-sectional structure of the conducting path 100 thus formed is as shown in FIG. 3.

Therefore, a potential level of the output terminal is the ground potential VSS in either of the chip-code creating units 11a, 11b, and 11c. If a value "0" is given when the potential level is equal to or equivalent to the ground potential VSS, and a value "1" is given when the potential level is equal to or equivalent to the power supply potential VCC, the values of the first bit, the second bit, and the third bit are "0", "0", and "0" respectively.

If the wiring pattern in the second wiring layer is to be changed to revise the logic or to improve the quality for a second version, the mask pattern for the second wiring layer is changed such that the fourth wiring part 24p is connected to the second power line 51 of the power supply potential VCC through the second connection wiring 41. In this case, the third wiring part 23p is not formed in the mound-shaped conducting path of the first stage in the chip-code creating unit 11a as shown in FIGS. 5 and 14.

Thus, the conducting path 100 having a structure shown in FIG. 5 is formed in the chip-code creating unit 11a of the first bit. Therefore, the output terminal 39 is disconnected from the starting terminal 20 that is connected to the ground potential VSS, but is connected to the power supply potential VCC through the fourth wiring part 24p, and the potential level of the output terminal 39 becomes the power supply potential VCC. The structures of the chip-code creating unit 11b of the second bit and the chip-code creating unit 11c of the third bit remain same as that of the first version. Therefore, the values of the third bit, the second bit, and the first bit are "0", "0" and "1" respectively.

If the wiring pattern in the third wiring layer is to be changed to revise the logic or to improve the quality for a third version, the mask pattern for the third wiring layer is changed such that the second wiring part 22q in the mound-shaped conducting path of the second stage is connected to the first power line 50 through the third connection wiring 42. In this case, the fifth wiring part 25p is not formed in the mound-shaped conducting path of the first stage in the chip-code creating unit 11a as shown in FIGS. 6 and 15. Thus, the conducting path 100 having a structure shown in FIG. 6 is formed in the chip-code creating unit 11a of the first bit. Therefore, the output terminal 39 is disconnected from the fourth wiring part 24p that is connected to the power supply potential VCC, but is connected to the ground potential VSS through the second wiring part 22q, and the potential level of the output terminal 39 becomes the ground potential VSS.

Figure 11:
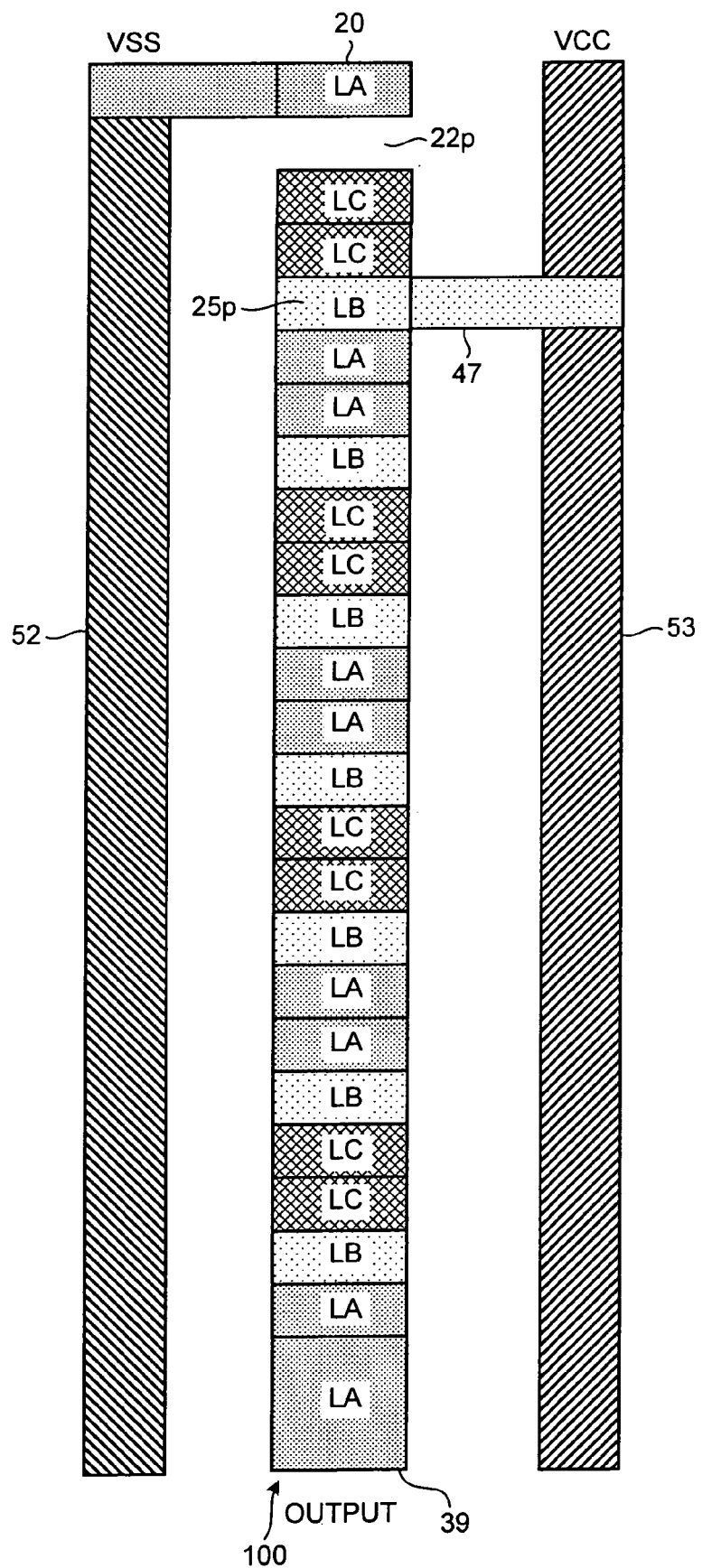
FIG. 11 is a plan view of the chip-information creating circuit (8)

As for the chip-code creating unit 11b of the second bit, as shown in FIG. 11, the mask pattern for the third wiring layer is changed such that the fifth wiring part 25p is connected to a second power line 53 of the power supply potential VCC through a fourth connection wiring 47. In this case, the second wiring part 22p is not formed in the mound-shaped conducting path of the first stage. Thus, the conducting path 100 having a structure shown in FIG. 11 is formed in the chip-code creating unit 11b of the second bit. Therefore, the output terminal 39 is disconnected from the starting terminal 20 that is connected to the ground potential VSS, but is connected to the power supply potential VCC through the fifth wiring part 25p, and the potential level of the output terminal 39 becomes the power supply potential VCC. The structure of the chip-code creating unit 11c of the third bit remains same as that of the first version and the second version. Therefore, the values of the third bit, the second bit, and the first bit are "0", "1", and "0" respectively.

If the wiring pattern in the first wiring layer is to be changed to revise the logic or to improve the quality for a fourth version, the mask pattern for the first wiring layer is changed such that a first wiring part 21r is connected to the second power line 51 through a fifth connection wiring 43. In this case, the sixth wiring part 26q is not formed in the mound-shaped conducting path of the second stage in the chip-code creating unit 11a as shown in FIGS. 7 and 16.

Thus, the conducting path 100 having a structure shown in FIG. 7 is formed in the chip-code creating unit 11a of the first bit. Therefore, the output terminal 39 is disconnected from the second wiring part 22q that is connected to the ground potential VSS, but is connected to the power supply potential VCC through the first wiring part 21r, and the potential level of the output terminal 39 becomes the power supply potential VCC. The structures of the chip-code creating unit 11b of the second bit and the chip-code creating unit 11c of the third bit remain same as that of the third version. Therefore, the values of the third bit, the second bit, and the first bit are "0", "1", and "1" respectively.

Figure 8:
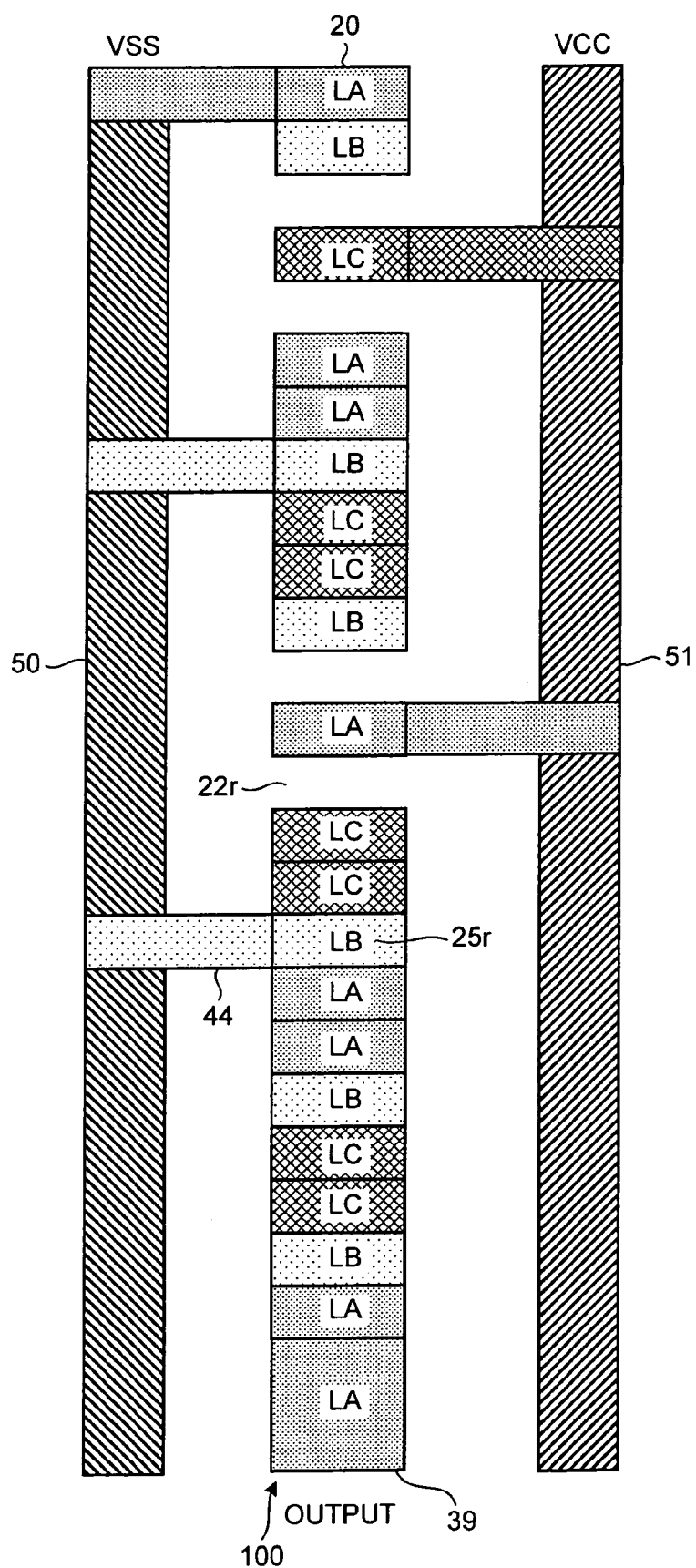
FIG. 8 is a plan view of the chip-information creating circuit (5)

If the wiring pattern in the third wiring layer is to be changed to revise the logic or to improve the quality for a fifth version, the mask pattern for the third wiring layer is changed such that a fifth wiring part 25r is connected to the first power line 50 through a sixth connection wiring 44. In this case, the second wiring part 22r is not formed in the mound-shaped conducting path of the third stage in the chip-code creating unit 11a as shown in FIG. 8. Thus, the conducting path 100 having a structure shown in FIG. 8 is formed in the chip-code creating unit 11a of the first bit. Therefore, the output terminal 39 is disconnected from the first wiring part 21r that is connected to the power supply potential VCC, but is connected to the ground potential VSS through the fifth wiring part 25r, and the potential level of the output terminal 39 becomes the ground potential VSS.

As for the chip-code creating unit 11b of the second bit, as shown in FIG. 12, the mask pattern for the third wiring layer is changed such that the fifth wiring part 25p is connected to a first power line 52 of the ground potential VSS through a seventh connection wiring 48. In this case, the second wiring part 22q is not formed in the mound-shaped conducting path of the second stage. Thus, the conducting path 100 having a structure shown in FIG. 12 is formed in the chip-code creating unit 11b of the second bit. Therefore, the output terminal 39 is disconnected from the fifth wiring part 25p that is connected to the power supply potential VCC, but is connected to the ground potential VSS through the fifth wiring part 25q, and the potential level of the output terminal 39 becomes the ground potential VSS. The structure of the chip-code creating unit 11c of the third bit remains same as the structure shown in FIG. 11. Therefore, the values of the third bit, the second bit, and the first bit are "1", "0", and "0" respectively.

If the wiring pattern in the third wiring layer is to be changed to revise the logic or to improve the quality for a sixth version, the mask pattern for the third wiring layer is changed such that a fifth wiring part 25s is connected to the second power line 51 through an eighth connection wiring 45. In this case, a second wiring part 22s is not formed in the mound-shaped conducting path of the fourth stage in the chip-code creating unit 11a as shown in FIG. 9.

Figure 9:
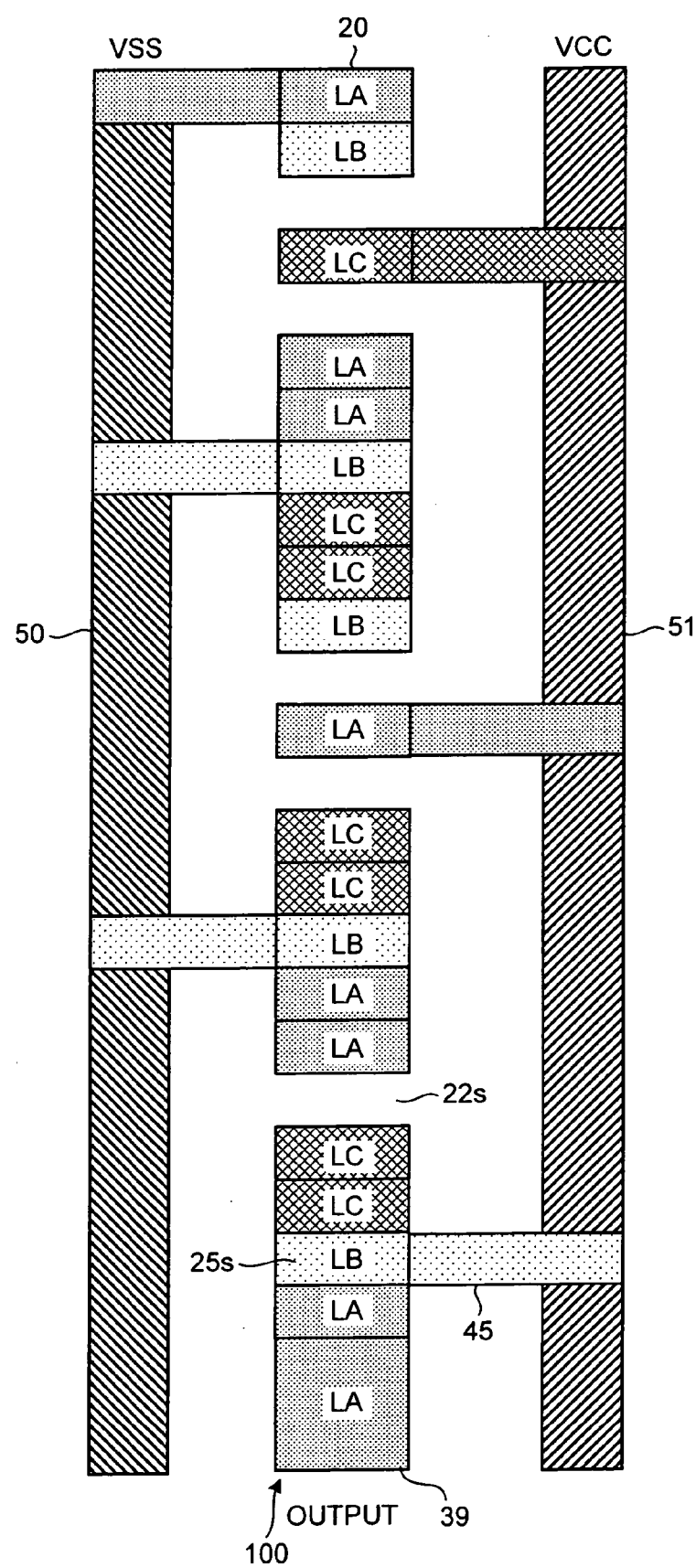
FIG. 9 is a plan view of the chip-information creating circuit (6)

Thus, the conducting path 100 having a structure shown in FIG. 9 is formed in the chip-code creating unit 11a of the first bit. Therefore, the output terminal 39 is disconnected from the fifth wiring part 25r that is connected to the ground potential VSS, but is connected to the power supply potential VCC through the fifth wiring part 25s, and the potential level of the output terminal 39 becomes the power supply potential VCC. The structures of the chip-code creating unit 11b of the second bit and the chip-code creating unit 11c of the third bit remain same as that of the fifth version. Therefore, the values of the third bit, the second bit, and the first bit are "1", "0" and "1" respectively.

Figure 10:
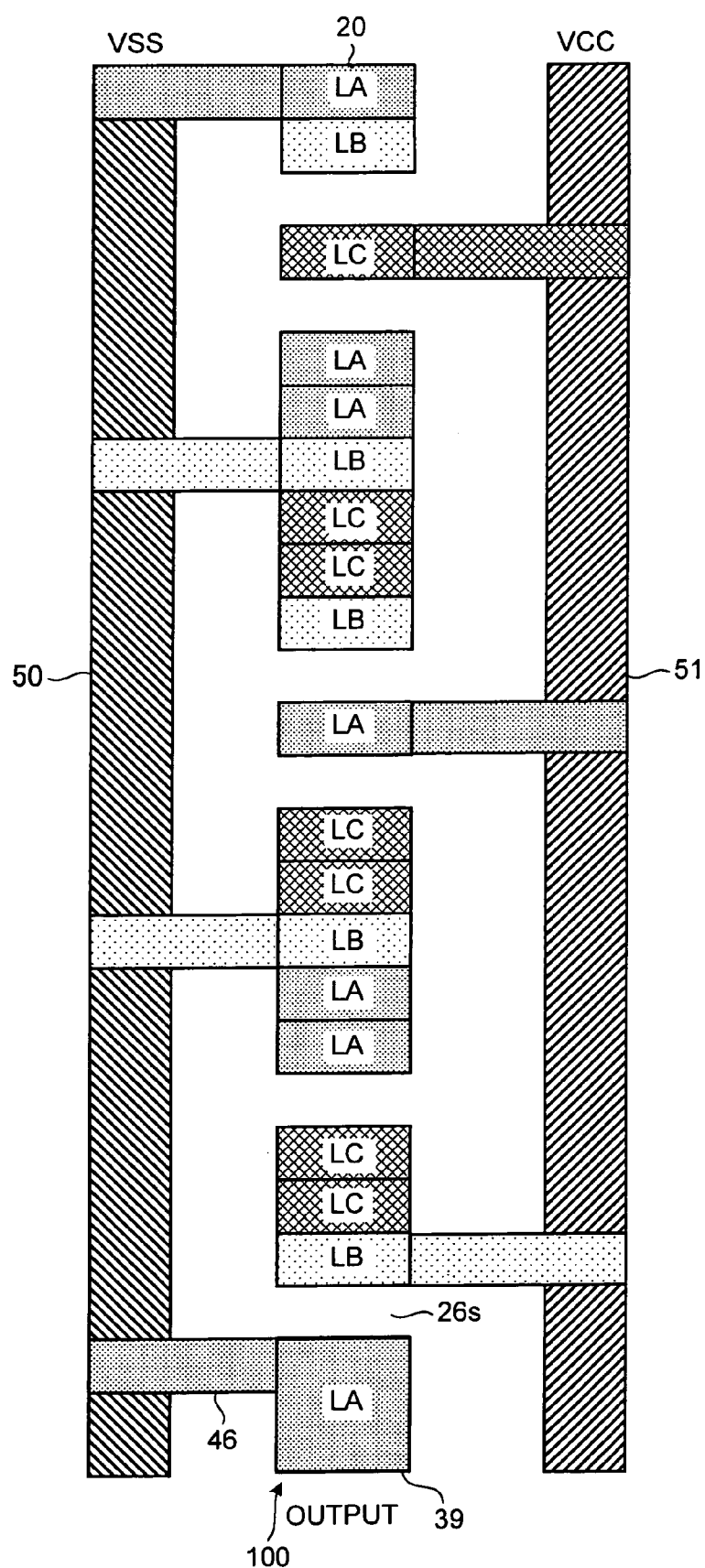
FIG. 10 is a plan view of the chip-information creating circuit (7)

If the wiring pattern in the first wiring layer is to be changed to revise the logic or to improve quality for a seventh version, the mask pattern for the first wiring layer is changed such that the output terminal 39 is connected to the first power line 50 through a ninth connection wiring 46. In this case, the sixth wiring part 26s is not formed in the conducting path of the fourth stage in the chip-code creating unit 11a as shown in FIG. 10. Thus, the conducting path 100 having a structure shown in FIG. 10 is formed in the chip-code creating unit 11a of the first bit. Therefore, the output terminal 39 is disconnected from the fifth wiring part 25s that is connected to the power supply potential VCC, but is connected to the ground potential VSS, and the potential level of the output terminal 39 becomes the ground potential VSS.

As for the chip-code creating unit 11b of the second bit, as shown in FIG. 13, the mask pattern for the first wiring layer is changed such that the first wiring part 21r in the mound-shaped conducting path of the third stage is connected to the second power line 53 through a tenth connection wiring 49. In this case, the sixth wiring part 26q is not formed in the mound-shaped conducting path of the second stage. Thus, the conducting path 100 having a structure shown in FIG. 13 is formed in the chip-code creating unit 11b of the second bit. Therefore, the output terminal 39 is disconnected from the fifth wiring part 25q that is connected to the ground potential VSS, but is connected to the power supply potential VCC through the first wiring part 21r, and the potential level of the output terminal 39 becomes the power supply potential VCC.

The structure of the chip-code creating unit 11c of the third bit remains same as that of the sixth version. Therefore, the values of the third bit, the second bit, and the first bit are "1", "1", and "0" respectively. As explained above, the chip information is updated by changing the conducting path 100 in a same wiring layer as a wiring layer in which the wiring pattern is changed to revise the logic or to improve the quality. A revising pattern of the version described above is an example, and the present invention is not limited to this example.

Figure 17:
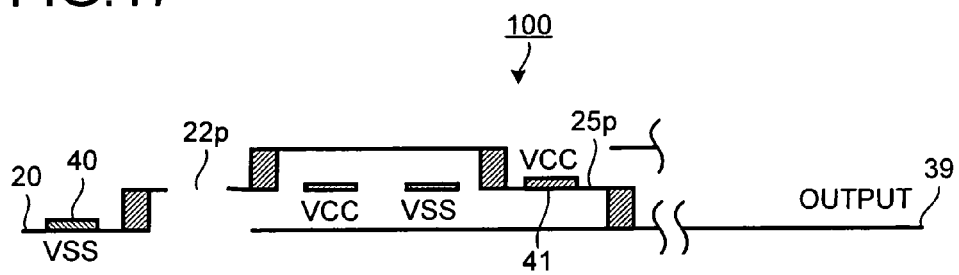
FIG. 17 is a cross-section of the chip-information creating circuit (4)

For example, when the wiring pattern in the third wiring layer is changed to revise the logic or to improve the quality, the mask pattern for the third wiring layer is changed such that the fifth wiring part 25p is connected to the first power line 50 through the second connection wiring 41 to be connected to the power supply potential VCC. In this case, the second wiring part 22p is not formed in the chip-code creating unit 11a of the first bit as shown in FIG. 17. Thus, the conducting path 100 having the structure shown in FIG. 6 is formed in the chip-code creating unit 11a of the first bit. The structures of the chip-code creating unit 11b of the second bit and the chip-code creating unit 11c of the third bit remain same as that of the first version.

Figure 18:
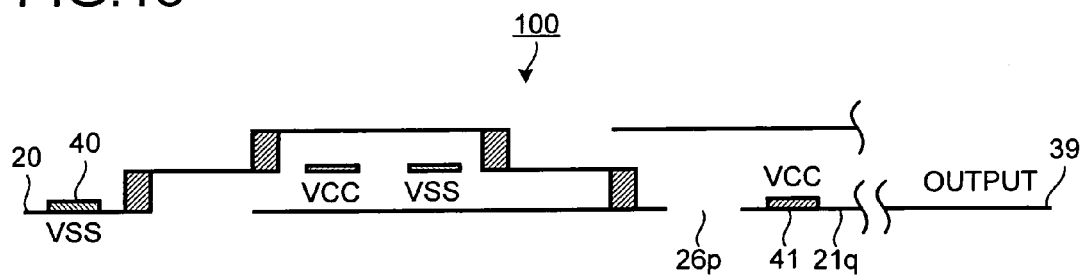
FIG. 18 is a cross-section of the chip-information creating circuit (5)

Moreover, when the wiring pattern of the first wring layer is changed to revise the logic or to improve the quality for the second version, the mask pattern for the third wiring layer is changed such that the first wiring part 21q in the mound-shaped conducting path of the second stage is connected to the first power line 50 through the second connection wiring 41 to be connected to the power supply potential VCC. In this case, the sixth wiring part 26p is not formed in the chip-code creating unit 11a of the first bit as shown in FIG. 18. Thus, the conducting path 100 having a structure shown in FIG. 18 is formed in the chip-code creating unit 11a of the first bit. The structures of the chip-code creating unit 11b of the second bit and the chip-code creating unit 11c of the third bit remain same as that of the first version.

Figure 19:
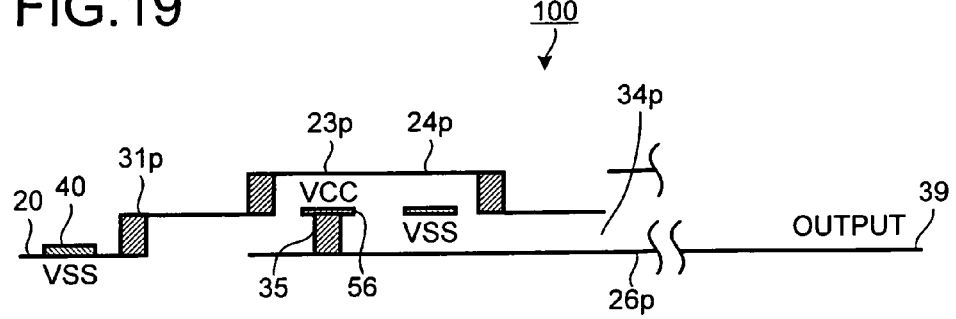
FIG. 19 is a cross-section of the chip-information creating circuit (6)

Furthermore, when a pattern of the via-hole to form a connecting part for connecting the wiring in the first wiring layer and the wiring in the third wiring layer is changed to revise the logic or to improve the quality for the second version, the mask pattern for the via-hole between the first wiring layer and the third wring layer is changed such that a connecting part 35 is newly formed. In this case, the fourth connecting part 34p (or the first connecting part 31p) is not formed in the chip-code creating unit 11a as shown in FIG. 19. The connecting part 35 connects the branch wiring 56 of the second power line 53, which is extended and reaches to the portion below the third wiring part 23p and the fourth wiring part 24p, and an extended portion of the sixth wiring 26p, which is extended and reaches to the portion below the branch wring 56.

Thus, the conducting path 100 having a structure shown in FIG. 19 is formed in the chip-code creating unit 11a. Therefore, the output terminal 39 is disconnected from the starting terminal 20 that is connected to the ground potential VSS, but is connected to the power supply potential VCC through the connecting part 35 newly formed. Thus, the power supply potential VCC is output from the output terminal 39. The structures of the chip-code creating unit 11b of the second bit and the chip-code creating unit 11c of the third bit remain same as that of the first version.

Figure 20:
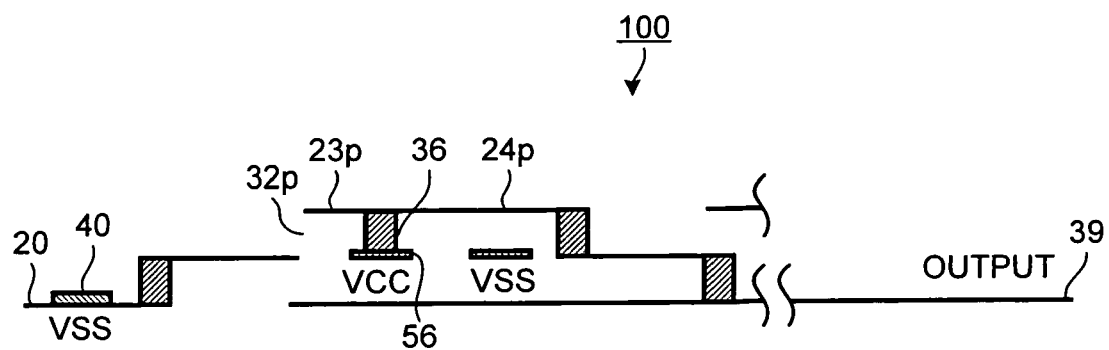
FIG. 20 is a cross-section of the chip-information creating circuit (7).

Moreover, when the pattern of the via-hole to form a connecting part for connecting the wiring in the third wiring layer and the wiring in the second wiring layer is changed to revise the logic or to improve the quality for the second version, the mask pattern for the via-hole between the third wiring layer and the second wring layer is changed such that a connecting part 36 is newly formed. In this case, the second connecting part 32p is not formed in the chip-code creating unit 11a as shown in FIG. 20. The connecting part 36 connects the third wiring part 23p or the fourth wiring part 24p and the branch wiring 56, which is extended and reaches to the portion below the third wiring part 23p and the fourth wiring part 24p.

Thus, the conducting path 100 having a structure shown in FIG. 20 is formed in the chip-code creating unit 11a. Therefore, the output terminal 39 is disconnected from the starting terminal 20 that is connected to the ground potential VSS, but is connected to the power supply potential VCC through the connecting part 36 newly formed. Thus, the power supply potential VCC is output from the output terminal 39. The structures of the chip-code creating unit 11b of the second bit and the chip-code creating unit 11c of the third bit remain same as that of the first version.

Revision for the third version and any later version may similarly be performed, and the potential level of output from the output terminal 39 may be switched. The potential level of the output from the output terminal 39 is switched by changing the wiring pattern or the pattern of the via-hole in the same wiring layer as the wiring layer in which the wiring pattern or the pattern of the via-hole is changed to revise the logic or to improve the quality. As explained above, it is possible to change the wiring pattern and the pattern of the via-hole for creating the chip information in the same wiring layer as the wiring layer in which the wiring pattern or the pattern of the via-hole is changed to revise the logic or to improve the quality. Therefore, it is possible to revise the chip information only by changing the pattern in the wiring layer or the layer of the via-hole in one of the wiring layers. Thus, a number of the mask that is re-formed according to the revision of the version can be reduced, thereby preventing the manufacturing cost for the revision from increasing.

The present invention is not limited to the embodiment described above, and various modifications can be made. For example, the number of the mound-shaped conducting path that is arranged in each of the chip-code creating units may be one, two, or three, or five and more. Moreover, a different number of the mound-shaped conducting path may be arranged in some or all of the chip-code creating units. A number of the wiring layer for creating the chip information may be two or four and more. The staring end 20 may be formed in the second wiring layer or the third wring layer. The output terminal 39 may be formed in the second wiring layer or the third wiring layer. The first potential level may be the power supply potential VCC, and the second potential level may be the ground potential VSS.

According to the present invention, it is possible to prevent a manufacturing cost from increasing.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device comprising:
wiring units that are arranged in a plurality of wiring layers repectively;
a starting terminal that is formed with the wiring unit that is arranged in one of the wiring layers; and
a connecting unit that electrically connects the wiring units in different wiring layers, wherein
the starting terminal is connected to a first potential level,
it is selectable whether to form the connecting unit by changing a mask pattern,
it is selectable whether to form the wiring unit by changing the mask pattern,
the wiring unit is connectable to either of the first potential level and a second potential level, and forms a conducting path that is continuously connected from either of the starting terminal and an arbitrary wiring unit to an output terminal via the connecting unit,
the conducting path is formed with a combination of a first path and a second path, the first path extending from a lower wiring layer to an upper wiring layer from the starting terminal toward the output terminal, the second path extending from the upper wiring layer to the lower wiring layer from the starting terminal toward the output terminal, and
the output terminal is either of the first potential level and the second potential level.

2. The semiconductor device according to claim 1, wherein each of the wiring layers includes a first power line that is connected to the first potential level; and a second power line that is connected to the second potential level.

3. The semiconductor device according to claim 2, wherein the wiring unit is connectable to either of the first power line and the second power line formed on the wiring layer that includes the wiring unit by changing the mask pattern.

4. The semiconductor device according to claim 1, wherein the conducting path is formed with two or more of the first path and one or more of the second path that are alternately fitted together between the starting terminal and the output terminal.

5. The semiconductor device according to claim 1, wherein the conducting path is formed with one or more of the first path and two or more of the second path that are alternately fitted together between the starting terminal and the output terminal.

6. The semiconductor device according to claim 4, wherein
the wiring layers that form the conducting path include
a first wring layer that is positioned at a lowermost portion;
a second wiring layer that is positioned at an uppermost portion; and
a third wiring layer that is arranged between the first wiring layer and the second wiring layer,
the first power line and the second power line in the third wiring layer extend to a portion below the conducting path, and
the wiring unit in the first wiring layer extends from the output terminal to below the portion.

7. The semiconductor device according to claim 5, wherein
the wiring layers that form the conducting path include
a first wring layer that is positioned at a lowermost portion;
a second wiring layer that is positioned at an uppermost portion; and
a third wiring layer that is arranged between the first wiring layer and the second wiring layer,
the first power line and the second power line in the third wiring layer extend to a portion below the conducting path, and
the wiring unit in the first wiring layer extends from the output terminal to below the portion.

8. The semiconductor device according to claim 4, wherein
the wiring layers that form the conducting path include
a first wring layer that is positioned at a lowermost portion;
a second wiring layer that is positioned at an uppermost portion; and
a third wiring layer that is arranged between the first wiring layer and the second wiring layer,
the first power line and the second power line in the third wiring layer extend to a portion above the conducting path, and
the wiring unit in the second wiring layer extends from the output terminal to above the portion.

9. The semiconductor device according to claim 5, wherein
the wiring layers that form the conducting path include
a first wring layer that is positioned at a lowermost portion;

a second wiring layer that is positioned at an uppermost portion; and
a third wiring layer that is arranged between the first wiring layer and the second wiring layer,
the first power line and the second power line in the third wiring layer extend to a portion above the conducting path, and
the wiring unit in the second wiring layer extends from the output terminal to above the portion.

10. The semiconductor device according to claim 6, wherein the portion and the wiring unit in the second wiring layer located above and below the portion or the wiring unit in the first wiring layer extending from the output terminal are connected with the connecting unit by changing the mask pattern.

11. The semiconductor device according to claim 7, wherein the portion and the wiring unit in the second wiring layer located above and below the portion or the wiring unit in the first wiring layer extending from the output terminal are connected with the connecting unit by changing the mask pattern.

12. The semiconductor device according to claim 8, the portion and the wiring unit in the first wiring layer located above and below the portion or the wiring unit in the second wiring layer extending from the output terminal are connected with the connecting unit by changing the mask pattern.

13. The semiconductor device according to claim 9, the portion and the wiring unit in the first wiring layer located above and below the portion or the wiring unit in the second wiring layer extending from the output terminal are connected with the connecting unit by changing the mask pattern.

14. A semiconductor device comprising a plurality of chip-code creating units that output either of a first potential level and a second potential level in response to a read request from an external unit, wherein
each of the chip-code creating units includes
wiring units that are arranged in a plurality of wiring layers respectively;
a starting terminal that is formed with the wiring unit that is arranged in one of the wiring layers; and
a connecting unit that electrically connects the wiring units in different wiring layers,
the starting terminal is connected to a first potential level,
it is selectable whether to form the connecting unit by changing a mask pattern,
it is selectable whether to form the wiring unit by changing the mask pattern,
the wiring unit is connectable to either of the first potential level and a second potential level, and forms a conducting path that is continuously connected from either of the starting terminal and an arbitrary wiring unit to an output terminal via the connecting unit,
the conducting path is formed with a combination of a first path and a second path, the first path extending from a lower wiring layer to an upper wiring layer from the starting terminal toward the output terminal, the second path extending from the upper wiring layer to the lower wiring layer from the starting terminal toward the output terminal, and
the output terminal is either of the first potential level and the second potential level.

15. The semiconductor device according to claim 14, wherein each of the wiring layers includes
a first power line that is connected to the first potential level; and a second power line that is connected to the second potential level.

16. The semiconductor device according to claim 15, wherein the wiring unit is connectable to either of the first power line and the second power line formed on the wiring layer that includes the wiring unit by changing the mask pattern.

17. The semiconductor device according to claim 14, wherein the conducting path is formed with two or more of the first path and one or more of the second path that are alternately fitted together between the starting terminal and the output terminal.

18. The semiconductor device according to claim 14, wherein the conducting path is formed with one or more of the first path and two or more of the second path that are alternately fitted together between the starting terminal and the output terminal.

19. The semiconductor device according to claim 17, wherein
the wiring layers that form the conducting path include
a first wring layer that is positioned at a lowermost portion;
a second wiring layer that is positioned at an uppermost portion; and
a third wiring layer that is arranged between the first wiring layer and the second wiring layer,
the first power line and the second power line in the third wiring layer extend to a portion below the conducting path, and
the wiring unit in the first wiring layer extends from the output terminal to below the portion.

20. The semiconductor device according to claim 18, wherein
the wiring layers that form the conducting path include
a first wring layer that is positioned at a lowermost portion;
a second wiring layer that is positioned at an uppermost portion; and
a third wiring layer that is arranged between the first wiring layer and the second wiring layer,
the first power line and the second power line in the third wiring layer extend to a portion below the conducting path, and
the wiring unit in the first wiring layer extends from the output terminal to below the portion.

21. The semiconductor device according to claim 17, wherein
the wiring layers that form the conducting path include
a first wring layer that is positioned at a lowermost portion;
a second wiring layer that is positioned at an uppermost portion; and
a third wiring layer that is arranged between the first wiring layer and the second wiring layer,
the first power line and the second power line in the third wiring layer extend to a portion above the conducting path, and
the wiring unit in the second wiring layer extends from the output terminal to above the portion.

22. The semiconductor device according to claim 18, wherein
the wiring layers that form the conducting path include
a first wring layer that is positioned at a lowermost portion;
a second wiring layer that is positioned at an uppermost portion; and
a third wiring layer that is arranged between the first wiring layer and the second wiring layer,
the first power line and the second power line in the third wiring layer extend to a portion above the conducting path, and
the wiring unit in the second wiring layer extends from the output terminal to above the portion.

23. The semiconductor device according to claim 19, wherein the portion and the wiring unit in the second wiring layer located above and below the portion or the wiring unit in the first wiring layer extending from the output terminal are connected with the connecting unit by changing the mask pattern.

24. The semiconductor device according to claim 20, wherein the portion and the wiring unit in the second wiring layer located above and below the portion or the wiring unit in the first wiring layer extending from the output terminal are connected with the connecting unit by changing the mask pattern.

25. The semiconductor device according to claim 21, the portion and the wiring unit in the first wiring layer located above and below the portion or the wiring unit in the second wiring layer extending from the output terminal are connected with the connecting unit by changing the mask pattern.

26. The semiconductor device according to claim 22, the portion and the wiring unit in the first wiring layer located above and below the portion or the wiring unit in the second wiring layer extending from the output terminal are connected with the connecting unit by changing the mask pattern.

* * * * *